(12) United States Patent
Watanabe et al.

(10) Patent No.: US 11,901,471 B2
(45) Date of Patent: Feb. 13, 2024

(54) SOLAR CELL, MULTI-JUNCTION SOLAR CELL, AND METHOD OF MANUFACTURING SOLAR CELL

(71) Applicant: Panasonic Holdings Corporation, Kadoma (JP)

(72) Inventors: Daiki Watanabe, Kanagawa (JP); Hirotaka Katayama, Osaka (JP)

(73) Assignee: PANASONIC HOLDINGS CORPORATION, Kadoma (JP)

( * ) Notice: Subject to any disclaimer, the term of this patent is extended or adjusted under 35 U.S.C. 154(b) by 0 days.

(21) Appl. No.: 17/826,552

(22) Filed: May 27, 2022

(65) Prior Publication Data
US 2022/0393053 A1   Dec. 8, 2022

(30) Foreign Application Priority Data

May 31, 2021   (JP) .................................. 2021-091142

(51) Int. Cl.
| | | |
|---|---|---|
| *H01L 31/0288* | (2006.01) | |
| *H01L 31/0352* | (2006.01) | |
| *H01L 31/18* | (2006.01) | |
| *H01L 31/20* | (2006.01) | |
| *H01L 31/0376* | (2006.01) | |
| *H01L 31/0687* | (2012.01) | |
| *H01L 31/054* | (2014.01) | |

(52) U.S. Cl.
CPC ...... *H01L 31/0547* (2014.12); *H01L 31/0288* (2013.01); *H01L 31/0352* (2013.01); *H01L 31/1804* (2013.01); *H01L 31/202* (2013.01); *H01L 31/03762* (2013.01); *H01L 31/0687* (2013.01)

(58) Field of Classification Search
CPC ............. H01L 31/0288; H01L 31/0352; H01L 31/0376; H01L 31/03762; H01L 31/0547; H01L 31/0687; H01L 31/0747; H01L 31/1804; H01L 31/202
See application file for complete search history.

(56) References Cited

U.S. PATENT DOCUMENTS

2019/0326453 A1 * 10/2019 Chang ................ H01L 31/02168
2020/0176618 A1   6/2020 Ahn et al.

FOREIGN PATENT DOCUMENTS

| JP | 5726377 B2 | 5/2015 |
| JP | 2015-185593 A | 10/2015 |
| WO | 2013/161668 A1 | 10/2013 |

OTHER PUBLICATIONS

The Extended European Search Report dated Nov. 3, 2022, issued in counterpart EP Application No. 22176052.3. (8 pages).

(Continued)

*Primary Examiner* — Mayla Gonzalez Ramos
(74) *Attorney, Agent, or Firm* — WHDA, LLP

(57) ABSTRACT

A solar cell includes: an n-type first amorphous silicon layer provided on a first main surface of a crystalline silicon substrate; an amorphous silicon oxide layer provided on a first main surface of the first amorphous silicon layer; and an n-type fine crystal silicon layer provided on a first main surface of the amorphous silicon oxide layer. An oxygen atom concentration in the first amorphous silicon layer, the amorphous silicon oxide layer, and the fine crystal silicon layer has a maximum value in the amorphous silicon oxide layer with a thickness direction.

10 Claims, 12 Drawing Sheets

(56) References Cited

OTHER PUBLICATIONS

Sasaki T et al: "Structural Properties of P-Type Microcrystalline Silicon as a Window Layer of Solar Cells", Japanese Journal of Applied Physics, Japan Society of Applied Physics, JP, vol. 39, No. 8, Part 01, Aug. 1, 2000 (Aug. 1, 2000), pp. 4707-4711, XP001014856; Cited in Extended European Search Report dated Nov. 3, 2022. (5 pages).

\* cited by examiner

Light-receiving surface (outermost fine crystal)

Rear surface (outermost amorphous)

SOLAR CELL, MULTI-JUNCTION SOLAR CELL, AND METHOD OF MANUFACTURING SOLAR CELL

CROSS REFERENCE TO RELATED APPLICATION

The entire disclosure of Japanese Patent Application No. 2021-91142 filed on May 31, 2021, including the specification, claims, drawings, and abstract, is incorporated herein by reference in its entirety.

TECHNICAL FIELD

The present disclosure relates to a solar cell, a multi-junction solar cell, and a method of manufacturing a solar cell.

BACKGROUND

A conventional solar cell is disclosed in Japanese Examined Patent Application Publication No. 5726377. As illustrated in FIG. 12, an amorphous silicon layer of a light-receiving surface in this solar cell 710 is finely crystallized to form a fine crystal silicon layer 715. A hetero-junction solar cell using an amorphous silicon layer has a problem in that parasitic absorption of the amorphous silicon layer of the light-receiving surface reduces light reaching a crystalline silicon substrate, which is a photoelectric conversion layer. In this solar cell 710, the amorphous silicon layer of the light-receiving surface is finely crystallized for increasing transparency of the silicon layer to increase an intensity of the light reaching the photoelectric conversion layer, resulting in improvement in an output of the solar cell 710.

SUMMARY

Technical Problem

As illustrated in FIG. 12, the above conventional solar cell 710 has an intrinsic fine crystal silicon layer 714 in addition to an intrinsic amorphous silicon layer 713 that achieves passivation. The intrinsic fine crystal silicon layer 714 is a seed layer for enhancing fine crystallization of a conductive silicon layer that is difficult to finely crystallize. This configuration increases a total thickness of the intrinsic layers 713 and 714, which have poor conductivity as compared with the conductive layer; thus, an internal resistance increases and a fill factor of the solar cell 710 is likely to decrease.

Here, a solar cell of the present disclosure can provide a solar cell that has a fine crystal silicon layer on a light-receiving surface so that an intensity of light reaching a photoelectric conversion layer can be increased and a fill factor can be easily increased.

Solution to Problem

To solve the above problem, the solar cell according to the present disclosure includes: a first amorphous silicon layer of a first conductivity type provided on a first main surface of a crystalline silicon substrate; an amorphous silicon oxide layer provided on a first main surface of the first amorphous silicon layer; and a microcrystalline silicon layer (also referred to as "fine crystal silicon layer" throughout the present disclosure) of the first conductivity type provided on a first main surface of the amorphous silicon oxide layer. An oxygen atom concentration in the first amorphous silicon layer, the amorphous silicon oxide layer, and the microcrystalline silicon layer has a maximum value in the amorphous silicon oxide layer with respect to a thickness direction.

The term "providing a layer on a first main surface" deservedly includes a case of providing the layer on the first main surface in direct contact, and also includes a case of providing the layer above the first main surface via one or more intermediate layers other than the layer. Each of the first amorphous silicon layer and the fine crystal silicon layer may include oxygen atoms and may include carbon atoms.

Advantageous Effects of Invention

The solar cell according to the present disclosure has the fine crystal silicon layer on a light-receiving surface so that an intensity of light reaching a photoelectric conversion layer can be increased and a fill factor can be easily increased.

BRIEF DESCRIPTION OF DRAWINGS

The figures depict one or more implementations in accordance with the present teachings, by way of example only, not by way of limitations. In the figures, like reference numerals refer to the same or similar elements. Embodiments of the present disclosure will be described based on the following figures, wherein:

In FIG. 2, the Raman spectra are compared between with and without an oxidation treatment after forming the amorphous silicon layer, that is, the presence and absence of an amorphous silicon oxide layer 14.

DESCRIPTION OF EMBODIMENTS

Figure 1:
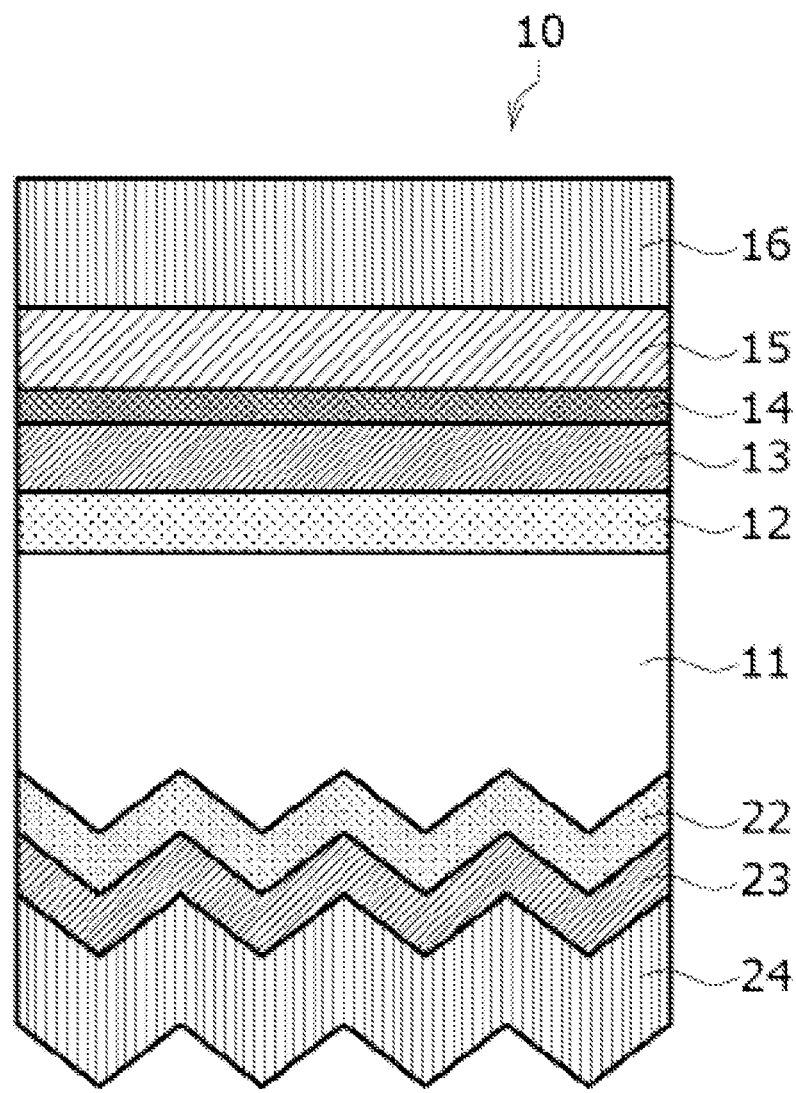
FIG. 1 is a schematic sectional view in a thickness direction of a solar cell of a first embodiment.

Hereinafter, embodiments according to the present disclosure will be described in detail with reference to the attached drawings. When a plurality of embodiments and modified examples are included below, it is anticipated in advance to appropriately combine features thereof to construct a new embodiment. In the following Examples, the same reference sips are used for the same constructions in the drawings, and an overlapped description is omitted. In the following description, a light-receiving surface means a surface where light mainly enters, and is a surface where more than 50% of light, for example 80% or more or 90% or more of light, enters. Solar cells 10, 210, 310, 410, 510 described below are aligned so that the light-receiving surfaces thereof direct to a side on which light mainly enters. A concentration of atoms, dopants, or impurities in a layer simply referred in the following description means an average concentration of the atoms, dopants, or impurities in the layer. In the following description of first and second embodiments and modified examples thereof providing a layer on a first main surface means providing the layer directly on the first main surface. However, when referring to providing a layer on a first main surface in the description of the first and second embodiments and modified examples thereof, the layer may be provided above the first main surface via one or more intermediate layers other than the layer. For example, as the one or more intermediate layers, one or more layers having a slightly modified film density or dope concentration from the layer referred to be provided on the first main surface may be used. Similarly, in the description of the first and second embodiments and modified examples thereof, providing a layer on a second main surface means providing the layer directly on the second main surface. However, when referring to providing a layer on a second main surface in the description of the first and second embodiments and modified examples thereof, the layer may be provided above the second main surface via one or more intermediate layers other than the layer. For example, as the one or more intermediate layers, one or more layers having a slightly modified film density or dope concentration from the layer referred to as being provided on the second main surface may be used. In addition, the same applies to a case when simply referring to providing a layer on a layer without using a term of the first main surface or the second main surface in the following description of the first and second embodiments and modified examples thereof. That is, referring to providing a second layer on a first layer herein and in the claims deservedly includes a case of providing the second layer directly on the first layer. The above reference also includes a case of providing the second layer indirectly above the first layer with one or more other intermediate layers and a case of the presence of one or more layers interposed between the second layer and the first layer. Among elements described below, elements that are not specified in an independent claim, the most generic concept, are optional elements, not essential elements.

First Embodiment

FIG. 1 is a schematic sectional view in a thickness direction (stacking direction) of a solar cell 10 of a first embodiment. As illustrated in FIG. 1, the solar cell 10 comprises: an n-type crystalline silicon substrate 11, as an example of a first conductivity type; a first passivation layer 12 constituted of an amorphous silicon material and provided on a first main surface, which is a light-receiving surface side, of the crystalline silicon substrate 11; an n-type first amorphous silicon layer 13 provided on a first main surface of the first passivation layer 12; an n-type amorphous silicon oxide layer 14 provided on a first main surface of the first amorphous silicon layer 13; an n-type fine crystal silicon layer 15 provided on a first main surface of the amorphous silicon oxide layer 14; and a first transparent electrode 16 on the light-receiving surface side provided on a first main surface of the fine crystal silicon layer 15.

An oxygen atom concentration in the first amorphous silicon layer 13, the amorphous silicon oxide layer 14, and the fine crystal silicon layer 15 has a maximum value in the amorphous silicon oxide layer 14 with respect to a thickness direction. The solar cell 10 further comprises: a second passivation layer 22 constituted of an amorphous silicon material and provided on a second main surface, which is a rear surface side, of the crystalline silicon substrate 11; a p-type second amorphous silicon layer 23, as an example of a second conductivity type, provided on a second main surface of the second passivation layer 22; and a second transparent electrode 24 on a rear surface side provided on a second main surface of the second amorphous silicon layer 23.

[Crystalline Silicon Substrate]

The crystalline silicon substrate 11 in the present embodiment is a monocrystalline silicon substrate, but the crystalline silicon substrate 11 may be a polycrystalline silicon substrate. An n-type dopant contained in the crystalline silicon substrate 11 is not particularly limited, and phosphorus (P) is typically used. The n-type dopant may be uniformly distributed in an entirety of the n-type crystalline silicon substrate 11. A high-doped region having a high dopant concentration of the n-type dopant may be present near a surface of at least one of the first main surface and the second main surface of the crystalline silicon substrate 11.

A thickness of the crystalline silicon substrate 11 is, for example, 50 to 500 µm. As the crystalline silicon substrate 11, a substrate manufactured by a Czochralski method (Cz method) is typically used, but a substrate manufactured by an epitaxial growth method may also be used. A concentration of the n-type dopant in the crystalline silicon substrate 11 is, for example, lower than $1 \times 10^{14}$ atoms/cm$^3$.

The crystalline silicon substrate 11 is washed with a cleaning liquid such as hydrofluoric acid aqueous solution and an RCA cleaning liquid before a chemical vapor deposition (CVD) process. In the first embodiment, a texture structure constituted with a pyramid-shaped roughness is formed on the second main surface, which is the rear surface side, of the crystalline silicon substrate 11. This texture structure is formed by using an alkaline etching liquid such as a potassium hydroxide aqueous solution and a sodium hydroxide aqueous solution. Forming the texture structure may reduce reflection loss on the surface due to multiple reflection of the light, and in addition, allows the light to be easily confined in the photoelectric conversion layer.

The texture structure may be constituted by surface treatment with photolithography. As a solar cell of a modified example described later, the texture structure may be formed on a first main surface, which is the light-receiving surface side, of the crystalline silicon substrate in addition to the second main surface of the crystalline silicon substrate. Alternatively, the texture structure may be formed only on the first main surface, which is the light-receiving surface side, of the crystalline silicon substrate, and is not necessarily formed on both of the first main surface and the second main surface of the crystalline silicon substrate.

[First Passivation Layer]

The first passivation layer 12 is formed on the first main surface of the crystalline silicon substrate 11. The first passivation layer 12 is formed by, for example, a plasma CVD or a catalytic CVD. The first passivation layer 12 inhibits recombination of carriers on the first main surface side of the crystalline silicon substrate 11. On the crystalline silicon substrate 11, the first passivation layer 12 is formed on, for example, the first main surface excluding an outer circumference region within 2 mm or narrower from an edge of the first main surface.

The first passivation layer 12 may be an i-type amorphous silicon layer. The i-type amorphous silicon layer is an amorphous silicon layer in which no impurity is intentionally doped. The first passivation layer 12 may contain an impurity in a manufacturing process of the solar cell 10, and typically contains a predetermined concentration of an n-type dopant. An average concentration of the n-type dopant (atom) in the first passivation layer 12 may be lower than $1\times10^{21}$ atoms/cm$^3$. The average concentration of the n-type dopant (atom) in the first passivation layer 12 is lower than an average concentration of the n-type dopant (atom) in the n-type first amorphous silicon layer 13, and lower than an average concentration of the n-type dopant (atom) in the n-type fine crystal silicon layer 15.

The first passivation layer 12 is formed to be thin for inhibiting light absorption as much as possible, whereas it is formed to be thick in a degree for sufficiently passivating the surface of the crystalline silicon substrate 11. A thickness of the first passivation layer 12 may be 3 nm to 10 nm. The thickness of the first passivation layer 12 is measured by a sectional analysis of the solar cell 10 with a transmission electron microscope (TEM). The same applies to other layers. The first passivation layer 12 may be formed with supplying a silicon-containing gas such as $SiH_4$ and, if necessary, $H_2$ as a diluting gas. In a case of the plasma CVD, the raw material gas is converted into plasma. In a case of the catalytic CVD, the raw material gas is heated with, for example, a metal wire heater as a catalyst material with supplying the raw material gas. During formation of the first passivation layer 12, a substrate temperature of the crystalline silicon substrate 11 may be 150° C. or higher and 300° C. or lower. The first passivation layer 12 is formed at a layer formation rate of, for example, 0.1 nm/sec to 0.5 nm/sec.

The first passivation layer 12 is formed with, for example, a gas having a ratio of $H_2$ gas with respect to $SiH_4$ gas, being within a range of 0 to 50 times. The first passivation layer 12 may include one or more atoms of hydrogen, oxygen, and carbon, and for example, may include all three of these atoms. A concentration of the n-type dopant in the first passivation layer 12 may have a gradation with a higher concentration near the first main surface, which is a boundary to the crystalline silicon substrate 11.

[First Amorphous Silicon Layer]

The n-type first amorphous silicon layer 13 is formed on the first main surface of the first passivation layer 12. The first amorphous silicon layer 13 is formed by, for example, a plasma CVD or a catalytic CVD. The first amorphous silicon layer 13 is constituted by, for example, doping P, which has n-type conductivity, into an amorphous semiconductor layer. The first amorphous silicon layer 13 includes the n-type dopant at a higher concentration than in the first passivation layer 12. An average concentration of the n-type dopant in the first amorphous silicon layer 13 may be lower than $1\times10^{22}$ atoms/cm$^3$, and is, for example, $1\times10^{20}$ to $1\times10^{22}$ atoms/cm$^3$.

The first amorphous silicon layer 13 may include one or more atoms of hydrogen, oxygen, and carbon, and for example, may include all three of these atoms.

The first amorphous silicon layer 13 is formed to be thin for inhibiting light absorption as much as possible. The first amorphous silicon layer 13 does not directly contact, or directly contacts with an extremely small area, the transparent electrode, differing from the p-type second amorphous silicon layer 23 that requires consideration of reducing contacting resistance with the transparent electrode. Thus, such contact with the transparent electrode requires low necessity of consideration. Therefore, the first amorphous silicon layer 13 is sufficient so long as it has a thickness and dark conductivity that can achieve the conductivity of the first passivation layer 12 by diffusion of carriers from the first amorphous silicon layer 13 to the first passivation layer 12 when contacting the first passivation layer 12. The first amorphous silicon layer 13 may be thinner than the second amorphous silicon layer 23. A conductivity of the first amorphous silicon layer 13 may be lower than a conductivity of the second amorphous silicon layer 23.

A thickness of the first amorphous silicon layer 13 may be 1 nm to 10 nm. A dark conductivity of the first amorphous silicon layer 13 when formed on a glass substrate may be $1\times10^{-8}$ S/cm or more. A substrate temperature of the crystalline silicon substrate 11 during formation of the first amorphous silicon layer 13 may be 150° C. or higher and 300° C. or lower. The first amorphous silicon layer 13 may be formed by, for example, supplying $SiH_4$, or may also be formed by implanting an n-type dopant (atom) into the first passivation layer 12, which is a lower layer.

[Amorphous Silicon Oxide Layer]

Forming the n-type amorphous silicon oxide layer 14 by oxidation treatment performed in the same CVD chamber as that for the first amorphous silicon layer 13, which is a lower layer, or the fine crystal silicon layer 15, which is an upper layer, may reduce a number of chambers and a process time of atmospheric exposure. Since the amorphous silicon oxide layer increases in resistance in the thickness direction (stacking direction) of the layer, a thickness of the amorphous silicon oxide layer may be 5 nm or less. A substrate temperature of the crystalline silicon substrate 11 during formation of the amorphous silicon oxide layer 14 may be 150° C. or higher and 300° C. or lower. The oxidation treatment may be performed by, for example, converting $CO_2$ gas into plasma in a case of the plasma CVD, or heating $CO_2$ gas with a metal wire heater as a catalyst material with supplying $CO_2$ gas in a case of the catalytic CVD. A time of the oxidation treatment may be 1 to 20 seconds.

[Fine Crystal Silicon Layer]

The n-type fine crystal silicon layer 15 is formed by using the plasma CVD or the catalytic CVD. The fine crystal silicon layer 15 includes P or the like, which is an n-type element. The fine crystal silicon layer 15 may also include oxygen and carbon. Since increasing an n-type dopant in the layer inhibits growth of the fine crystals, an average dopant density of the n-type dopant in the fine crystal silicon layer 15 may be designed to be lower than $1\times10^{22}$ atoms/cm$^3$, and may be, for example, $1\times10^{20}$ to $1\times10^{22}$ atoms/cm$^3$.

Since the fine crystal silicon layer 15 has a higher transparency than the first amorphous silicon layer 13, a thickness of the fine crystal silicon layer 15 may be larger than that of the first passivation layer 12 or that of the first amorphous silicon layer 13. The thickness of the fine crystal silicon layer 15 may be 5 nm to 100 nm. More specifically, when the solar cell 10 is used with single junction as the present embodiment, the thickness of the fine crystal silicon layer 15 may be 10 to 30 nm. When a plurality of the solar cells is joined to be used as a multi-junction solar cell as a second embodiment, described later, the thickness of the fine crystal silicon layer 15 may be 50 to 100 nm. A dark conductivity of the fine crystal silicon layer 15 when formed on a glass substrate may be $1 \times 10^{-5}$ S/cm or more. When the fine crystal silicon layer 15 is formed above a glass substrate as the next layer to the first amorphous silicon layer 13 and the amorphous silicon oxide layer 14 for forming a sample to be measured by Raman spectroscopy, a peak derived from crystalline silicon may be observed near a wave number of 520 $cm^{-1}$.

When a sample in which only the fine crystal silicon layer 15 is formed on a glass substrate to be measured by Raman spectroscopy and a signal near 520 $cm^{-1}$ (kayser) is present, the fine crystallization of the fine crystal silicon layer 15 may be confirmed. Here, the signal may be a local peak near 520 $cm^{-1}$, or the signal may behave as a substantial plane near 520 $cm^{-1}$ on the graph or may be change in a gradient (for example, change in a gradient at 1.1 times or more) near 520 $cm^{-1}$. The signal may also be presence of an inflection point near 520 $cm^{-1}$. The presence of the signal near 520 $cm^{-1}$ may be confirmed by the special behavior near 520 $cm^{-1}$ in the graph obtained by Raman spectroscopy.

Figure 2:
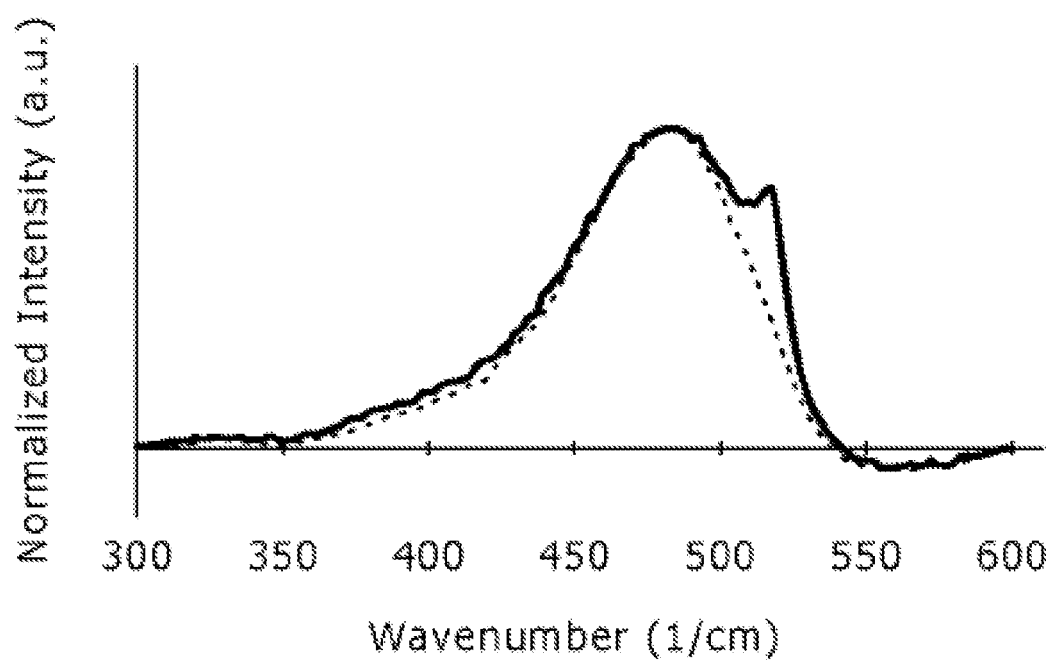
FIG. 2 is the result of Raman spectroscopy upon formation of an amorphous silicon layer and a fine crystal silicon layer in this order on a glass substrate.

FIG. 2 shows the results of Raman spectroscopy upon formation of the amorphous silicon layer and the fine crystal silicon layer in this order on a glass substrate. In FIG. 2, the Raman spectra were compared between with and without the oxidation treatment after forming the amorphous silicon layer, that is, the presence and absence of the amorphous silicon oxide layer 14. As indicated in FIG. 2, no peak could be confirmed near 520 $cm^{-1}$ for the sample without the oxidation treatment, whereas the peak could be confirmed near 520 $cm^{-1}$ for the sample with the oxidation treatment. Accordingly, the oxidation treatment; that is, formation of the amorphous silicon oxide layer 14, may enhance the fine crystallization of the fine crystal silicon layer 15 even on the amorphous silicon layer.

A substrate temperature of the crystalline silicon substrate 11 during formation of the fine crystal silicon layer 15 may be 100° C. or higher and 300° C. or lower. Since an excessively high layer formation rate of the fine crystal silicon layer 15 hardly enhances the fine crystallization, the layer formation rate may be 0.2 nm/sec or lower. During the formation of the fine crystal silicon layer 15, a ratio of $H_2$ gas with respect to $SiH_4$ may be set within a range of 10 to 300 times.

[Chamber in which Each Layer on Light-Receiving Side is Produced]

The amorphous silicon oxide layer 14 and the fine crystal silicon layer 15 are more easily formed in the same chamber, and the amorphous silicon oxide layer 14 and the fine crystal silicon layer 15 may be produced in the same chamber. The first amorphous silicon layer 13 and the amorphous silicon oxide layer 14 are produced with substantially the same easiness even in the same chamber and in different chambers. However, forming the first amorphous silicon layer 13, the amorphous silicon oxide layer 14, and the fine crystal silicon layer 15 in the same chamber eliminates necessity of atmospheric exposure between forming each layer and transferring works between chambers. Thus, a cycle time may be shortened and an apparatus cost may also be reduced. When the cycle time and the apparatus cost are not considered, the fine crystal silicon layer 15 may be produced by using a special chamber requiring a high frequency power source.

[First Transparent Electrode]

The first transparent electrode 16 may be formed on a substantial entirety of the first main surface of the fine crystal silicon layer 15. When a substantially square crystalline silicon substrate 11 having a side of 120 to 210 mm is used, for example, the first transparent electrode 16 is formed within a range not to expand from each of the layers 12 to 15 and within a range excluding an outer circumference region within 5 mm or narrower from an edge of the crystalline silicon substrate 11. The first transparent electrode 16 is constituted of, for example, a transparent conductive oxide (such as IWO and ITO) in which a metal oxide such as indium oxide ($In_2O_3$) and zinC oxide (ZnO) is doped with a dopant such as tungsten (W), tin (Sn), antimony (Sb), or zirconium (Zr). A thickness of the first transparent electrode 16 is, for example, 10 to 200 nm.

Although not illustrated, a collector electrode may be provided on a first main surface of the first transparent electrode 16. The collector electrode may include a plurality of finger electrodes. The plurality of finger electrodes, which are wire-shaped electrodes formed in substantially parallel to each other, is formed in a wide range on the crystalline silicon substrate 11 to collect generated carriers. The collector electrode is wider than the finger electrode, and may include a bus bar electrode substantially perpendicular to each finger electrode. As the first embodiment, the collector electrode may be provided when the solar cell 10 is used with single junction. Meanwhile, when a plurality of the solar cells are joined to be used in tandem as the second embodiment described later, a top cell may be formed directly on the first transparent electrode 16. At this time, the collector electrode may not be needed.

[Second Passivation Layer]

The second passivation layer 22 is formed on the second main surface of the crystalline silicon substrate 11. The second passivation layer 22 is formed by, for example, plasma CVD or catalytic CVD. The second passivation layer 22 inhibits recombination of carriers on the second main surface side of the crystalline silicon substrate 11. On the crystalline silicon substrate 11, the second passivation layer 22 is formed on, for example, the second main surface excluding an outer circumference region within 2 mm or narrower from an edge of the second main surface.

The second passivation layer 22 may be an i-type amorphous silicon layer. The i-type amorphous silicon layer is an amorphous silicon layer in which no impurity is intentionally doped. The second passivation layer 22 may contain an impurity in a manufacturing process of the solar cell 10, and typically contains a predetermined concentration of a p-type dopant. An average concentration of the p-type dopant (atom) in the second passivation layer 22 may be lower than $1 \times 10^{21}$ atoms/$cm^3$. The average concentration of the p-type dopant (atom) in the second passivation layer 22 is lower than an average concentration of the p-type dopant (atom) in the p-type second amorphous silicon layer 23.

The second passivation layer 22 is formed to be thin for inhibiting light absorption as much as possible, whereas it is formed to be thick in a degree for sufficiently passivating the surface of the crystalline silicon substrate 11. A thickness of the second passivation layer 22 may be 3 nm to 10 nm.

The second passivation layer 22 may be formed by supplying a silicon-containing gas such as $SiH_4$ and, if necessary, $H_2$ as a diluting gas by converting the raw material gas into plasma or by operating a heater while supplying the raw material gas. During formation of the second passivation layer 22, a substrate temperature of the crystalline silicon substrate 11 may be 150° C. or higher and 300° C. or lower. The second passivation layer 22 is formed at a layer formation rate of, for example, 0.1 nm/sec to 0.5 nm/sec. The second passivation layer 22 is formed with a gas having a ratio of $H_2$ gas with respect to $SiH_4$ gas being within a range of, for example, 0 to 50 times. The second passivation layer 22 may include one or more atoms of hydrogen, oxygen, and carbon, and for example, may include all three of these atoms.

[Second Amorphous Silicon Layer]

The p-type second amorphous silicon layer 23 is formed on the second main surface of the second passivation layer 22. The second amorphous silicon layer 23 is formed by, for example, plasma CVD or catalytic CVD. The second amorphous silicon layer 23 is constituted by, for example, doping an amorphous semiconductor layer with B having p-type conductivity. An average concentration of the p-type dopant in the second amorphous silicon layer 23 may be lower than $1\times10^{22}$ atoms/cm$^3$, and may be, for example, $1\times10^{20}$ to $1\times10^{22}$ atoms/cm$^3$. The second amorphous silicon layer 23 includes the p-type dopant at a higher concentration than in the second passivation layer 22.

The second amorphous silicon layer 23 may further include one or more of hydrogen, oxygen, and carbon, and for example, may include all three of these atoms. To achieve a contacting resistance with the second transparent electrode 24, a thickness of the second amorphous silicon layer 23 may be 5 nm to 20 nm, and a dark conductivity of the second amorphous silicon layer 23 when formed on a glass substrate may be $1\times10^{-5}$ S/cm or more. A substrate temperature of the crystalline silicon substrate 11 during formation of the second amorphous silicon layer 23 may be 100° C. or higher and 300° C. or lower. The second amorphous silicon layer 23 is formed at a layer formation rate of, for example, 0.1 nm/sec to 0.5 nm/sec, and is formed at a ratio of $H_2$ gas with respect to $SiH_4$ gas being within a range of 0 to 50 times.

[Second Transparent Electrode]

The second transparent electrode 24 may be formed on a substantial entirety of the second main surface of the second amorphous silicon layer 23. When a substantially square crystalline silicon substrate 11 having a side of 120 to 160 mm is used, for example, the second transparent electrode 24 is formed within a range not to expand from each of the layers 22 and 23 and within a range excluding an outer circumference region within 2 mm or narrower from an edge of the crystalline silicon substrate 11. The second transparent electrode 24 is constituted of, for example, a transparent conductive oxide (such as IWO and ITO) in which a metal oxide such as indium oxide ($In_2O_3$) or zinc oxide (ZnO) is doped with a dopant such as tungsten (W), tin (Sn), antimony (Sb), or zirconium (Zr). A thickness of the second transparent electrode 24 is, for example, 10 to 200 nm.

Although not illustrated, a collector electrode is provided on a second main surface of the second transparent electrode 24. The collector electrode may include a plurality of finger electrodes. The plurality of finger electrodes, which are wire-shaped electrodes formed substantially in parallel to each other, is formed in a wide range on the crystalline silicon substrate 11 to collect generated carriers. The collector electrode is wider than the finger electrode, and may include a bus bar electrode substantially perpendicular to each finger electrode. A collector electrode formed on the rear surface side may be larger than a collector electrode formed on the light-receiving surface side, and may also be a metal layer formed on substantially the entirety of the second transparent electrode 24.

[IV Measurement on Solar Cells of Examples 1 to 4 and Comparative Example 1]

The present inventors performed IV measurement on solar cells of Examples 1 to 4 and a solar cell of Comparative Example 1.

<Solar Cell of Example 1>

Figure 3:
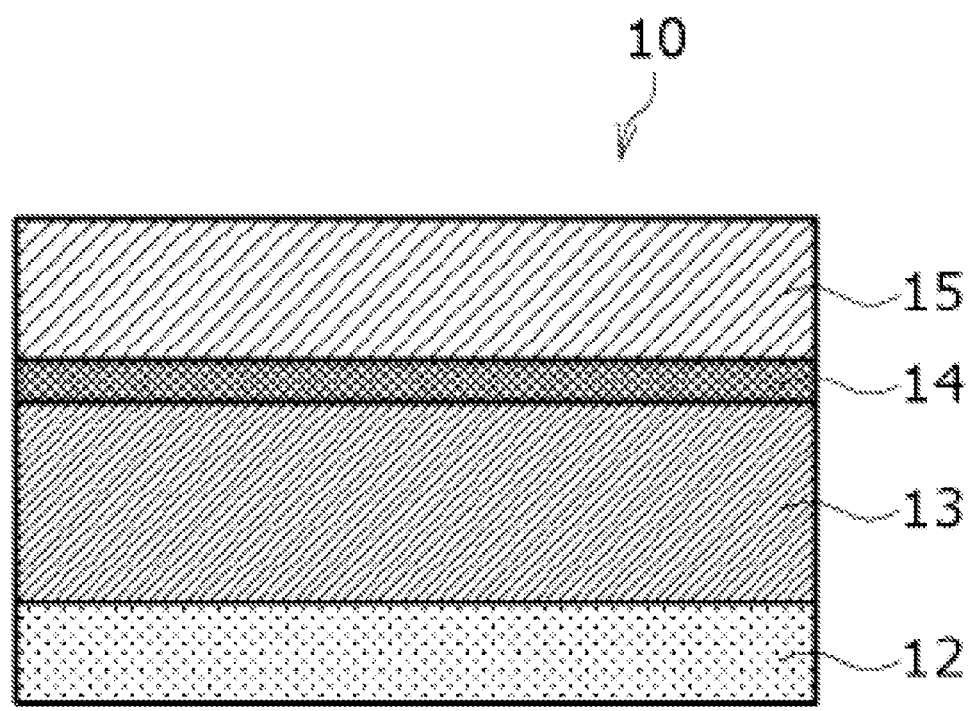
FIG. 3 is a schematic sectional view for illustrating a stacked part mainly relating to an effect of a solar cell of Example 1.

FIG. 3 is a schematic sectional view for illustrating a stacked part mainly relating to an effect of the solar cell 10 of Example 1. The solar cell 10 of Example 1 has a structure similar to that of the solar cell 10 illustrated in FIG. 1. The solar cell 10 of Example 1 has no texture structure on the first main surface of the crystalline silicon substrate 11, and has the texture structure on the second main surface of the crystalline silicon substrate 11. As illustrated in FIG. 3, the solar cell 10 of Example 1 comprises: the first passivation layer 12 constituted of the i-type amorphous silicon layer, the first amorphous silicon layer 13; the amorphous silicon oxide layer 14; and the fine crystal silicon layer 15, in this order on the first main surface side of the crystalline silicon substrate, not illustrated. In the solar cell 10 of Example 1, $CO_2$ gas was supplied to an n-type amorphous silicon for approximately 10 seconds for performing the oxidation treatment to form the amorphous silicon oxide layer 14 having a thickness of less than 6 nm.

<Solar Cell of Example 2>

A solar cell of Example 2 was produced in the same manner as in the solar cell of Example 1, except that $CO_2$ gas was supplied to the n-type amorphous silicon for approximately 10 seconds for performing the oxidation treatment to form the amorphous silicon oxide layer 14 having a thickness of less than 2 nm.

<Solar Cell of Example 3>

A solar cell of Example 3 was produced in the same manner as in the solar cell of Example 1, except that $CO_2$ gas was supplied to the n-type amorphous silicon for approximately 20 seconds for performing the oxidation treatment to form the amorphous silicon oxide layer 14.

<Solar Cell of Example 4>

The first amorphous silicon layer 13 was produced by a method other than a forming method with supplying $SiH_4$. Specifically, a raw material gas (dope gas) such as $PH_3$ or $B_2H_6$ was supplied to the first main surface of the i-type amorphous silicon, and then the raw material gas was converted into plasma or the heater was operated while supplying the raw material gas. As such a method, the n-type dopant was implanted onto the first main surface side of the i-type amorphous silicon to form a first amorphous silicon layer. Then, the produced amorphous silicon layer was subjected to the oxidation treatment by supplying $CO_2$ gas for approximately 10 seconds to form the first passivation layer 12, the first amorphous silicon layer 13, and the amorphous silicon oxide layer 14. Except for the above point, a solar cell of Example 4 was produced in the same manner as in the solar cell of Example 1.

<Solar Cell of Comparative Example 1>

Figure 4:
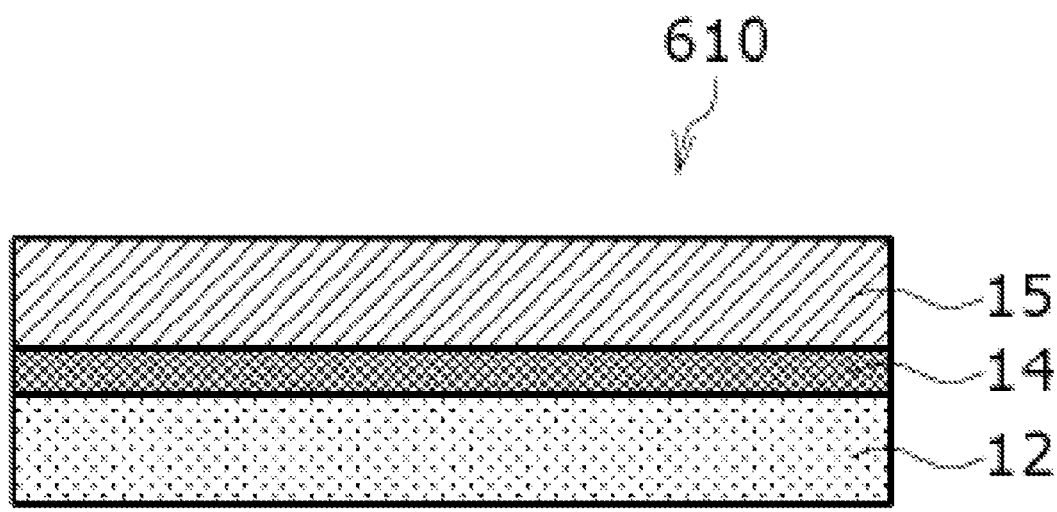
FIG. 4 is a schematic sectional view of a stacked part corresponding to the stacked part illustrated in FIG. 3 in the solar cell of Example 1.

A solar cell of Comparative Example 1 differs from the solar cell 10 illustrated in FIG. 1 only in a point in that the stacked part illustrated in FIG. 3 was substituted with the stacked part illustrated in FIG. 4. Specifically, in the solar cell of Comparative Example 1, which was a solar cell 610, the first amorphous silicon layer 13 was not provided on the first main surface of the first passivation layer 12 constituted of the i-type amorphous silicon layer, and the amorphous silicon oxide layer 14 was formed directly on the first main surface of the first passivation layer 12. In the solar cell of Comparative Example 1, $CO_2$ gas was supplied for approximately 10 seconds to a boundary between the i-type amorphous silicon and the n-type fine crystal silicon for performing the oxidation treatment to form the first passivation layer 12, the amorphous silicon oxide layer 14, and the fine crystal silicon layer 15.

(IV Measurement Result)

IV measurement was performed to obtain results in Table 1 on each of the above five different solar cells, which had one-surface flat structure and had the texture structure only on the second main surface of the crystalline silicon substrate. Each value of the following physical quantities in Examples 1 to 4 in Table 1 is a relative value based on each value in Comparative Example 1 being 100. In Table 1. Jsc represents a short circuit current [A], and Voc represents an open circuit voltage [V]. FF represents a fill factor, and η represents a conversion efficiency [%] of the solar cell.

TABLE 1

|  | Jsc | Voc | FF | η |
| --- | --- | --- | --- | --- |
| Comparative Example 1 | 100 | 100 | 100 | 100 |
| Example 1 | 97 | 107 | 110 or more | 110 or more |
| Example 2 | 99 | 107 | 110 or more | 110 or more |
| Example 3 | 100 | 108 | 110 or more | 110 or more |
| Example 4 | 100 | 106 | 110 or more | 110 or more |

As shown in Table 1, as compared with Comparative Example 1, all of Examples 1 to 4 have a higher fill factor by 10% or more and have a higher conversion efficiency η by 10% or more. Each of Examples 1 to 4 provides the n-type first amorphous silicon layer 13 between the first passivation layer 12 and the amorphous silicon oxide layer 14. According to the present disclosure, a solar cell having a remarkably higher fill factor and a remarkably higher conversion efficiency η than a solar cell that has no n-type first amorphous silicon layer 13 between the first passivation layer 12 and the amorphous silicon oxide layer 14 may be produced.

The present inventors presume the reason to be as follows. Specifically, the solar cell of Comparative Example 1 has the amorphous silicon oxide layer formed by the oxidation treatment for approximately 10 seconds between the passivation layer having a low atomic concentration of a conductive impurity and the conductive fine crystal silicon layer. Thus, carrier diffusion from the conductive fine crystal silicon layer to the passivation layer is inhibited to allow the passivation layer to keep the low conductivity. The deterioration of conductivity of the passivation layer presumably affects the deterioration of the fill factor of the solar cell.

In contrast, the solar cell of Example 1 was produced by forming the conductive amorphous silicon layer with a thickness of approximately 6 nm following formation of the passivation layer, then forming a conductive amorphous silicon oxide thin layer by the oxidation treatment, and then forming the conductive fine crystal silicon layer. In the solar cell of Example 1, the passivation layer and the conductive amorphous silicon layer are contacted to allow easy diffusion of carriers from the conductive amorphous silicon layer to the passivation layer. As a result, conductivity of the passivation layer may be increased. This configuration presumably provides a remarkably higher fill factor than the solar cell of Comparative Example 1.

Despite having the conductive amorphous silicon layer with a reduced thickness from 6 nm to approximately 2 nm, the solar cell of Example 2 keeps the high fill factor. Such a significant reduction of the thickness of the low-transparent amorphous silicon layer also improves Jsc.

The solar cell of Example 3 was produced by extending the time of the oxidation treatment from approximately 10 seconds to approximately 20 seconds. A longer time of the oxidation treatment may increase a thickness of the amorphous silicon oxide layer to thereby lower the conductivity. Such a longer time may lower the fill factor to thereby deteriorate manufacturing stability. However, as the solar cell of Example 3, the lack of oxidation treatment between the passivation layer and the conductive amorphous silicon layer may keep the high fill factor even with such an extended time of the oxidation treatment.

In the solar cell of Example 4, a part of the passivation layer was substituted with the conductive amorphous silicon layer. Such a substitution may improve the fill factor, achieved in Examples 1 to 3, and may thin the amorphous silicon layer because layer formation was not performed, resulting in improvement in Jsc.

[IV Measurement on Solar Cells of Examples 5 and 6 and Comparative Example 2]

Figure 5:
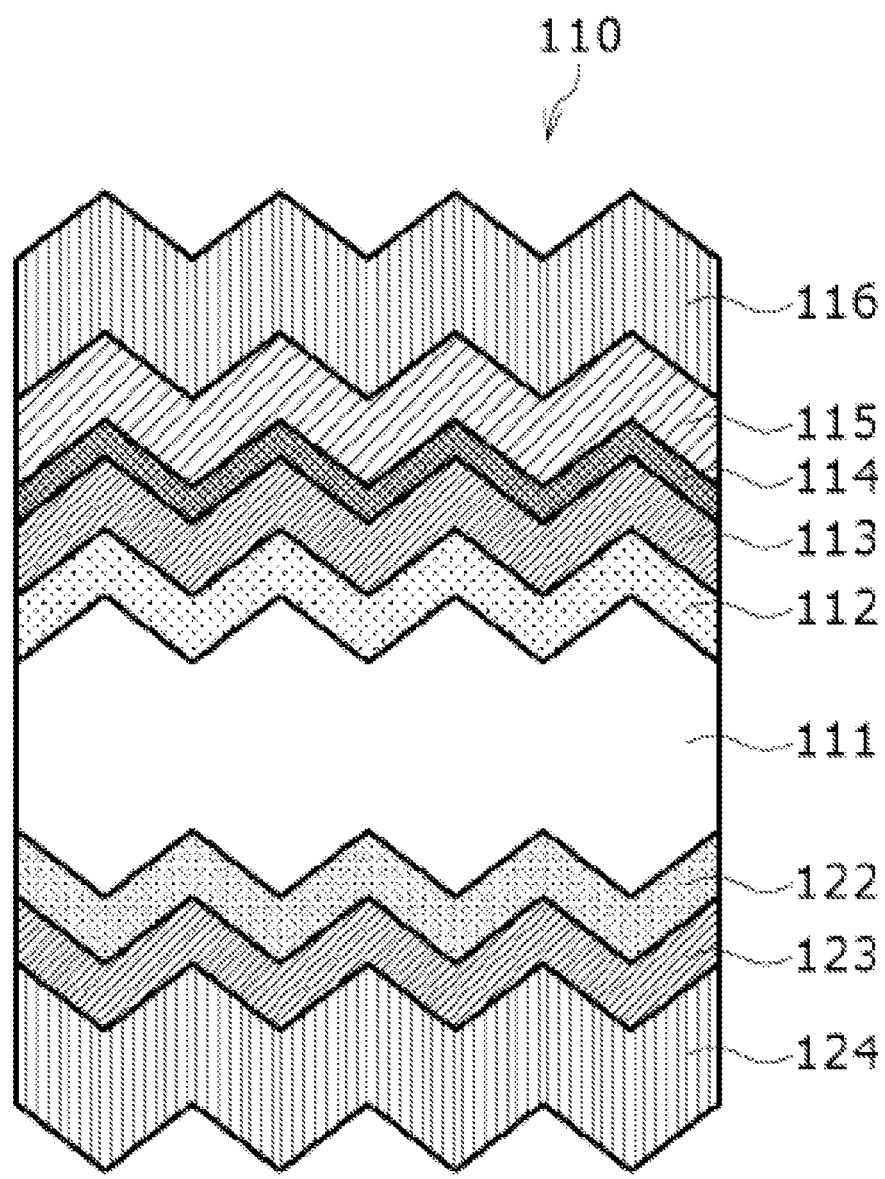
FIG. 5 is a schematic sectional view of a solar cell having texture structures on both of a first main surface and a second main surface of a crystalline silicon substrate. The solar cell in FIG. 5 corresponds to that in FIG. 1, except for the texture structures.

The present inventors also performed IV measurement on solar cells differing from the solar cell 10 illustrated in FIG. 1 only in terms of formation of the texture structure on both of the first main surface and second main surface of the crystalline silicon substrate. FIG. 5 is a schematic sectional view of solar cells 110 of Examples 5 and 6 with the thickness direction corresponding FIG. 1.

As illustrated in FIG. 5, each of the solar cells 110 of Examples 5 and 6 has the texture structure also on the first main surface, which is the light-receiving surface side, of a crystalline silicon substrate 111. Thus, a pyramid-shaped roughness is also formed on the first main surface and second main surface of each layer provided on the first main surface side of the crystalline silicon substrate 111. The roughness corresponds to the texture structure of the first main surface of the crystalline silicon substrate 111.

More specifically, as illustrated in FIG. 5, the solar cell 110 of Examples 5 and 6 comprises: a first passivation layer 112 constituted of an amorphous silicon material and provided on a first main surface, which is a light-receiving surface side, of the crystalline silicon substrate 111; an n-type first amorphous silicon layer 113 provided on a first main surface of the first passivation layer 112; an n-type amorphous silicon oxide layer 114 provided on a first main surface of the first amorphous silicon layer 113; an n-type fine crystal silicon layer 115 provided on a first main surface of the amorphous silicon oxide layer 114; and a first transparent electrode 116 on the light-receiving surface side provided on a first main surface of the fine crystal silicon layer 115. The solar cell 110 further comprises: a second passivation layer 122 constituted of an amorphous silicon material and provided on a second main surface, which is a rear surface side, of the crystalline silicon substrate 111; a p-type second amorphous silicon layer 123, serving as an example of a second conductivity type, provided on a second main surface of the second passivation layer 122; and a second transparent electrode 124 on the rear surface side provided on a second main surface of the amorphous silicon layer 123. Here, the first main surfaces and second main surfaces of each of the layers 112 to 116 and 122 to 124 have the pyramid-shaped roughness.

<Solar Cell of Example 5>

A solar cell of Example 5 was a solar cell 110 that was produced in the same producing conditions as in the solar cell of Example 1 except that the texture structure was formed on both of the first main surface and second main surface of the crystalline silicon substrate 111. That is, the supplying time of the $CO_2$ gas in the solar cell of Example 5 was approximately 10 seconds.

<Solar Cell of Example 6>

A solar cell of Example 6 was a solar cell 110 that was produced in the same producing conditions as in the solar cell of Example 3 except that the texture structure was formed on both of the first main surface and second main surface of the crystalline silicon substrate 111. That is, the supplying time of the $CO_2$ gas in the solar cell of Example 6 was approximately 20 seconds.

<Solar Cell of Comparative Example 2>

A solar cell of Comparative Example 2 was a solar cell that was produced in the same producing condition as in the solar cell of Comparative Example 1 except that the texture structure was formed on both of the first main surface and second main surface of the crystalline silicon substrate. That is, in the solar cell of Comparative Example 2, $CO_2$ gas was supplied for 10 seconds to a boundary between the i-type amorphous silicon and the n-type fine crystal silicon to perform the oxidation treatment.

(IV Measurement Result)

Table 2 shows IV measurement results. In Table 2, each value of the following physical quantities of Examples 5 and 6 is a relative value based on each value in Comparative Example 2 being 100. In Table 2, Jsc represents a short circuit current [A], Voc represents an open circuit voltage [V], FF represents a fill factor, and η represents a conversion efficiency [%] of the solar cell.

TABLE 2

|  | Jsc | Voc | FF | η |
| --- | --- | --- | --- | --- |
| Comparative Example 2 | 100 | 100 | 100 | 100 |
| Example 5 | 97 | 107 | 110 or more | 110 or more |
| Example 6 | 99 | 107 | 110 or more | 110 or more |

Solar cells shown in Table 2 have the texture structure on both of the first main surface and second main surface of the crystalline silicon substrate. The solar cells in Examples provide the conductive amorphous silicon layer between the amorphous silicon oxide layer and the passivation layer, and the solar cell in Comparative Example has no conductive amorphous silicon layer between the amorphous silicon oxide layer and the passivation layer. It was confirmed that providing such a conductive amorphous silicon layer may significantly improve the fill factor and the conversion efficiency η by 10% or more comparing to the comparative solar cell having no conductive amorphous silicon layer.

[IV Measurement on Solar Cells of Examples 5 and 6 and Comparative Example 2]

The present inventors also performed IV measurement on solar cells differing from the solar cell 10 illustrated in FIG. 1 only in formation of the texture structure on both of the first main surface and second main surface of the crystalline silicon substrate. FIG. 5 is a schematic sectional view of the above solar cell with the thickness direction corresponding FIG. 1. FIG. 5 is a schematic sectional view of the solar cells 110 of Examples 5 and 6 with the thickness direction corresponding to FIG. 1.

[Measurement of Surface Roughness on Fine Crystal Silicon Layer and on p-Type Amorphous Silicon Layer on Rear Surface Side]

The solar cell 110 illustrated in FIG. 5 has the texture structure on both of the first main surface and second main surface of the crystalline silicon substrate 111. Based on a TEM image of a cross section of the solar cell 110, the present inventors estimated a surface roughness on the fine crystal silicon layer 115 and a surface roughness on the p-type second amorphous silicon layer 123 on the rear surface side. The surface roughness on these two layers 115 and 123 were compared. Specifically, arithmetic-average roughness Ra was applied as the surface roughness on these two layers 115 and 123. Each of the surface roughness on the two layers 115 and 123 was estimated within a length of 80 nm on a slope in the TEM image.

(Measurement Results of Surface Roughness)

Table 3 shows the measurement results of the surface roughness Ra.

TABLE 3

|  | Ra |
| --- | --- |
| n-type flue crystal silicon layer | approximately 2 nm |
| p-type amorphous silicon layer | 0.5 nm or smaller |

According to the measurement results, it was confirmed that a surface roughness Ra on the fine crystal silicon layer of the first conductivity type may be higher than a roughness Ra on the amorphous silicon layer of the second conductivity type. In this test, the first conductivity type corresponds to the n-type fine crystal silicon layer 115, and the second conductivity type corresponds to the p-type second amorphous silicon layer 123. The surface roughness Ra may be increased by thickening the fine crystal silicon layer 115 or by slowing the oxidation treatment or the layer formation rate to enhance the fine crystallization. Thus, regulating the thickness of the fine crystal silicon layer 115 and the like may regulate the difference in the surface roughness Ra on the fine crystal silicon layer 115 of the first conductivity type and on the second amorphous silicon layer 123 of the second conductivity type. For example, the surface roughness Ra on the fine crystal silicon layer 115 may be regulated to be equal to or higher than the surface roughness Ra on the second amorphous silicon layer 123.

Figure 6:
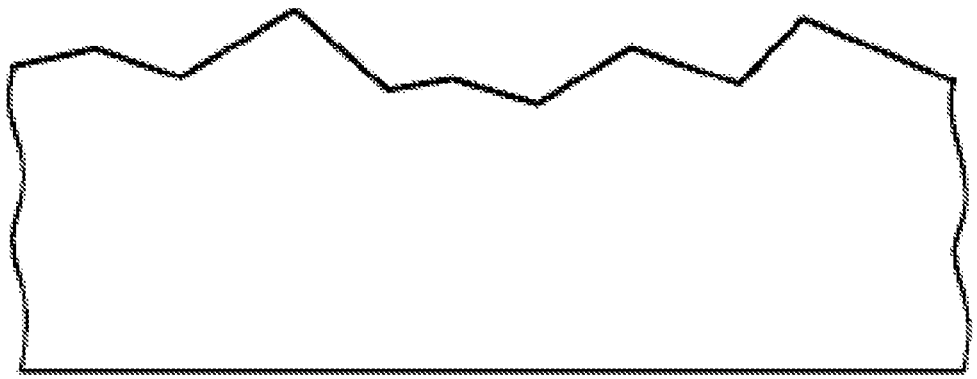
FIG. 6 is a schematic sectional view for illustrating a shape of a first main surface of a fine crystal silicon layer of a first conductivity type.
Figure 7:
FIG. 7 is a schematic sectional view for illustrating a shape of a second main surface of an amorphous silicon layer of a second conductivity type.

To achieve the excellent power generation performance, particularly within a wide wavelength region, a multi-junction solar cell may be formed. In such a case, as a bottom cell illustrated in FIG. 6 and FIG. 7, the surface of the fine crystal silicon layer of the first conductivity type may be formed more roughly than the surface of the amorphous silicon layer of the second conductivity type.

Consideration is given to, for example, a bottom cell constituted with a silicon material solar cell having a silicon substrate (for example, the solar cell illustrated in FIG. 1) and a top cell constituted with a perovskite solar cell having a perovskite substrate. In this case, each layer of the perovskite solar cell may be formed by dry process such as deposition or by wet process such as spin coating, die coating, and ink jet. In particular with the wet process, hydrophilicity (contact angle) of the perovskite solar cell material to the bottom cell presumably changes depending on a surface roughness of the bottom cell.

Accordingly, the hydrophilicity (contact angle) of the perovskite solar cell material is expected to affect a particle size and particle density of the perovskite crystals, and these changes are expected to affect manufacturing process stability of the perovskite solar cell. Thus, it is expected that the surface roughness on the light-receiving surface of the bottom cell using the fine crystal silicon layer of the first conductivity type is regulated independently on the rear surface to contribute to improvement in the manufacturing process stability of the top cell, which is formed thereon. A more detailed structure of an example of the multi-junction solar cell will be described in the following second embodiment. To reduce the reflection loss generated between the perovskite solar cell and the photoelectric conversion layer of the silicon solar cell, a reflective index of the interposed amorphous silicon layer, fine crystal silicon layer, or transparent electrode is required to be regulated. Providing a fine crystal silicon layer that can have a reflective index differing from the amorphous silicon is expected to maximize an intensity of light reaching the photoelectric conversion layer of the silicon solar cell; that is, the crystalline silicon substrate.

Second Embodiment

Figure 8:
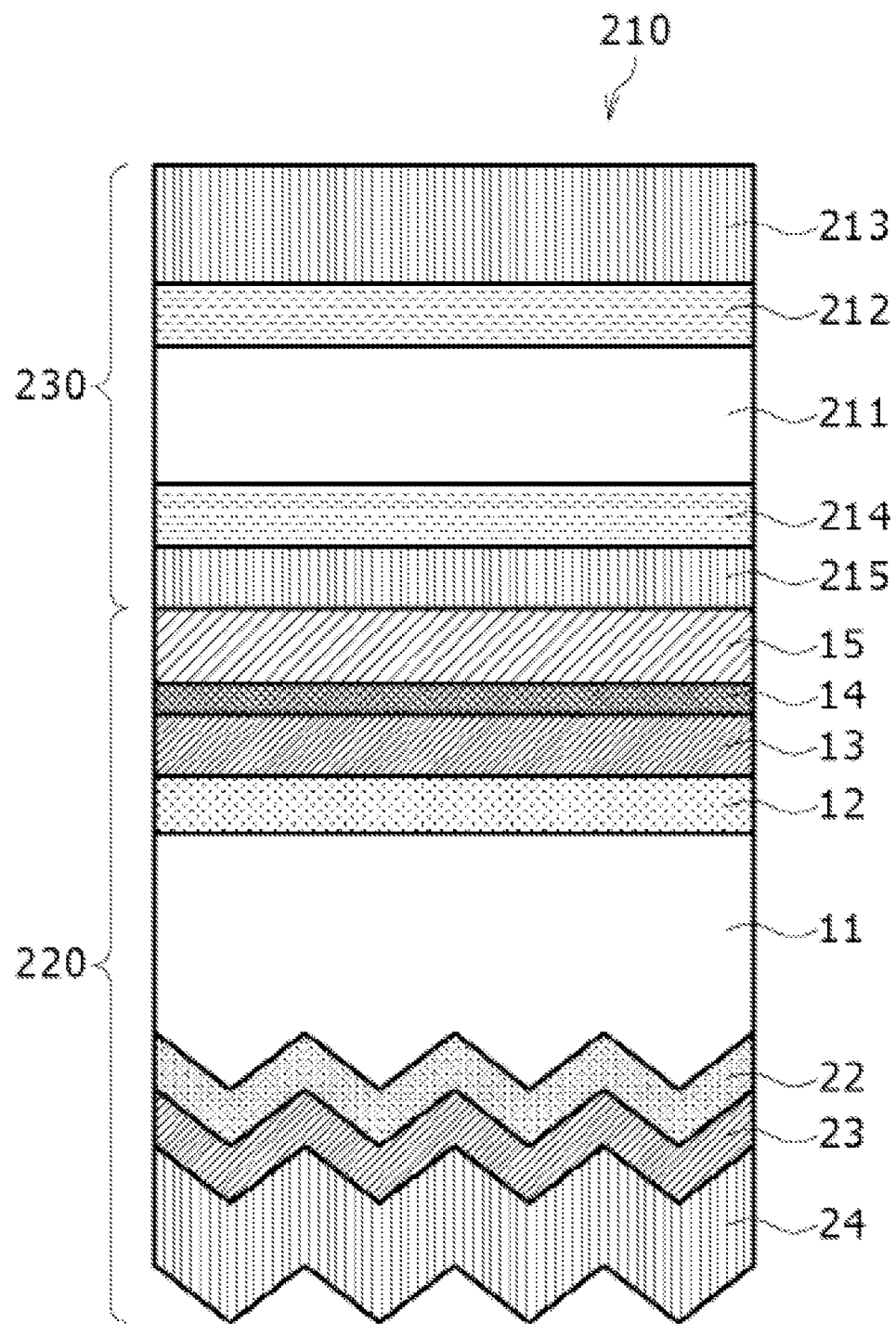
FIG. 8 is a schematic sectional view in a thickness direction of a multi-junction solar cell of a second embodiment of the present disclosure.

FIG. 8 is a schematic sectional view in a thickness direction of the multi-junction solar cell 210 of the second embodiment of the present disclosure. As illustrated in FIG. 8, the multi-junction solar cell (hereinafter, simply referred to as a solar cell) 210 has a structure in that a top cell 230 is joined to a light-receiving surface of a bottom cell 220. The bottom cell 220 has a structure differing from the solar cell 10 illustrated in FIG. 1 only in eliminating the first transparent electrode 16. The fine crystal silicon layer 15 includes the light-receiving surface of the bottom cell 220. In the bottom cell 220, a surface roughness Ra on an n-type fine crystal silicon layer 15 is higher than a surface roughness Ra on a p-type second amorphous silicon layer 23.

The top cell 230 may be constituted of any known perovskite solar cell. The top cell 230 comprises: a photoelectric conversion layer 211 constituted of perovskite crystals; an electron transport layer 212 provided on a first main surface, which is a light-receiving surface side, of the photoelectric conversion layer 211; a first transparent electrode 213 provided on a first main surface of the electron transport layer 212; a positive hole transport layer 214 provided on a second main surface, which is a rear surface side, of the photoelectric conversion layer 211; and a second transparent electrode 215 provided on a second main surface of the positive hole transport layer 214.

The photoelectric conversion layer 211 is a light absorption layer. The photoelectric conversion layer 211 includes a compound having a perovskite structure represented by a compositional formula $AMX_3$ as a light absorption material. A represents a monovalent cation. Examples of A include monovalent cations such as an alkali metal cation or an organic cation. More specific examples of A include methylammonium cation ($CH_3NH_3^+$), formamidinium cation ($NH_2CHNH_2^+$), cesium cation ($Cs^+$), and rubidium cation ($Rb^+$). M represents a divalent cation. M is, for example, a divalent cation of a transition metal or Groups 13 to 15 elements. More specific examples of M include $Pb^{2+}$, $Ge^{2+}$, and $Sn^{2+}$. X represents a monovalent anion such as a halide anion. Each site of A, M, and X may be occupied with a plurality of types of ions. Specific examples of the compound having the perovskite structure include $CH_3NH_3PbI_3$, $CH_3CH_2NH_3PbI_3$, $NH_2CHNH_2PbI_3$, $CH_3NH_3PbBr_3$, $CH_3NH_3PbCl_3$, $CsPbI_3$, $CsPbBr_3$, $RbPbI_3$, and $RbPbBr_3$. The photoelectric conversion layer 211 has a larger band gap than silicon. The photoelectric conversion layer 211 may contain an impurity. The photoelectric conversion layer 211 may further contain a compound other than the perovskite compound. The photoelectric conversion layer 211 may have a thickness of, for example, 100 nm or more and 10 μm or less, and for example, 100 nm or more and 1000 nm or less.

The electron transport layer 212 includes a semiconductor. Examples of the semiconductor include an organic or inorganic n-type semiconductor. Examples of the organic n-type semiconductor include an imide compound, a quinone compound, and a fullerene, and a derivative thereof. As the inorganic semiconductor, an oxide of a metal element may be used, for example. As the oxide of the metal element, an oxide of Cd, Zn, In, Pb, Mo, W, Sb, Bi, Cu, Hg, Ti, Ag, Mn, Fe, V, Sn. Zr, Sr, Ga, or Cr may be used, for example. More specific examples of the oxide include tin oxide and titanium oxide. The electron transport layer 212 may have a stacked structure including a plurality of layers made of different materials, and may have, for example, a stacked structure stacking tin oxide and $C_{60}$ (fullerene) from the bottom.

The positive hole transport layer 214 is constituted of an organic material, a self-assembly monomolecular film, or an inorganic material such as a metal oxide. The positive hole transport layer 214 is constituted of, for example, poly-3-hexylthiophene (P3HT), poly[bis(4-phenyl)(2,4,6-trimethylphenyl)amine] (PTAA), a polythiophene derivative such as polyethylenedioxythiophene (PEDOT), 2,2',7,7'-tetrakis (N,N'-di-p-methoxyphenylamine)-9,9'-spirobifluorene (Spiro-OMeTAD), nickel oxide, or molybdenum oxide. The positive hole transport layer 214 may include a plurality of layers formed of materials different from each other. The positive hole transport layer 214 may contain a supporting electrolyte and a solvent. Containing the supporting electrolyte and the solvent may stabilize positive holes in the positive hole transport layer 214.

The first transparent electrode 213 and the second transparent electrode 215 are constituted by, for example, a transparent conductive oxide (such as IWO and ITO) in which a metal oxide such as indium oxide ($In_2O_3$) or zinC oxide (ZnO) is doped with a dopant such as tungsten (W), tin (Sn), antimony (Sb), or zirconium (Zr).

The solar cell 210 comprises: the bottom cell 220 having the crystalline silicon substrate; and the top cell 230 having the photoelectric conversion layer 211 having a larger band gap than silicon and provided on the bottom cell 220. This configuration allows the power generation performance to become excellent with light having a wide wavelength region and to improve the output. Since the surface roughness Ra on the n-type fine crystal silicon layer 15 is higher than the surface roughness Ra on the p-type second amorphous silicon layer 23, the manufacturing process stability of the top cell 230 may be improved.

Figure 9:
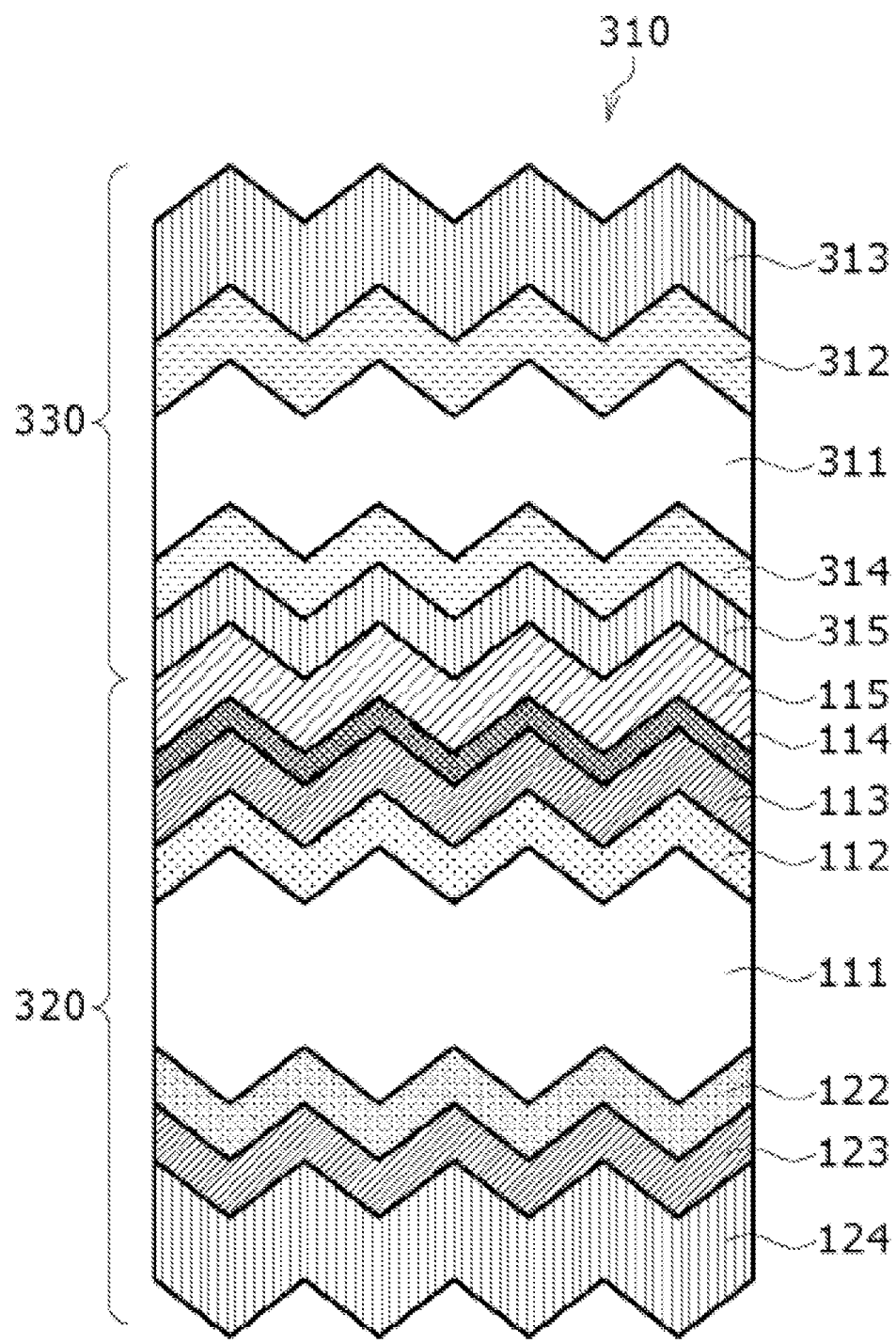
FIG. 9, corresponding to FIG. 8, is a schematic sectional view in a thickness direction of a multi-junction solar cell of a modified example of the second embodiment.

As the crystalline silicon substrate of the bottom cell 220, there is applied a crystalline silicon substrate 11 having a texture structure only on the second main surface, which is the rear surface side. However, a crystalline silicon substrate 111 having the texture structure on the first main surface, which is the light-receiving surface side, in addition to the second main surface, which is the rear surface side, may be applied as the crystalline silicon substrate of a bottom cell 320. Such a crystalline silicon substrate 111 is illustrated in FIG. 9, which is a schematic sectional view in a thickness direction of a multi-junction solar cell 310 of a modified example and which corresponds to FIG. 8.

In a top cell 330, a pyramid-shaped roughness may be formed on both of the first and second main surface of each of a photoelectric conversion layer 311 constituted of perovskite crystals, an electron transport layer 312, a first transparent electrode 313, a positive hole transport layer 314, and a second transparent electrode 315. The above roughness is similar to the texture structure formed on the first main surface of the crystalline silicon substrate 111. A structure with a relaxed roughness on the lower layer may be applied by thickening any of the layers in the top cell. Specifically, in the top cell, thickening any of the layers in the top cell is likely to thicken the layer at a bottom portion of the roughness of the texture structure, whereas it is likely to thin the layer at a top portion of the roughness, resulting in easy relaxation of the roughness. In particular, the relaxation of the roughness of the texture structure is likely to be remarkable when the wet process is selected.

Although the top cell 230, 330 is described as being the perovskite solar cell, the top cell may also be any solar cell other than the perovskite solar cell. Here, the top cell is constituted with the solar cell having the photoelectric conversion layer having a larger band gap than silicon.

Figure 10:
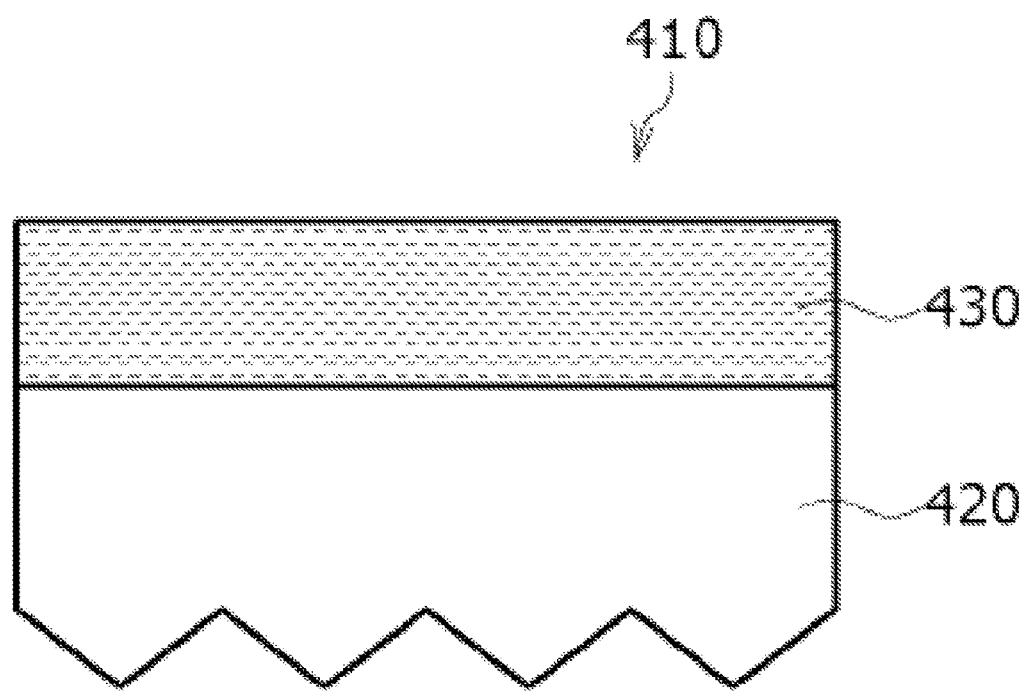
FIG. 10, corresponding to FIG. 8, is a schematic sectional view in a thickness direction of a multi-junction solar cell of another modified example of the second embodiment.

Also, in this case, the texture structure may be formed only on the second main surface, which is the rear surface side, of the crystalline silicon substrate constituted of a silicon material in a bottom cell 420. Such a configuration is illustrated in FIG. 10, a schematic sectional view in a thickness direction of a multi-junction solar cell 410 of another modified example, corresponding to FIG. 8. In the multi-junction solar cell 410, the top cell 430, which is constituted on the light-receiving surface side of the bottom cell 420, is of any type so long as it has the photoelectric conversion layer having a larger band gap than silicon.

Figure 11:
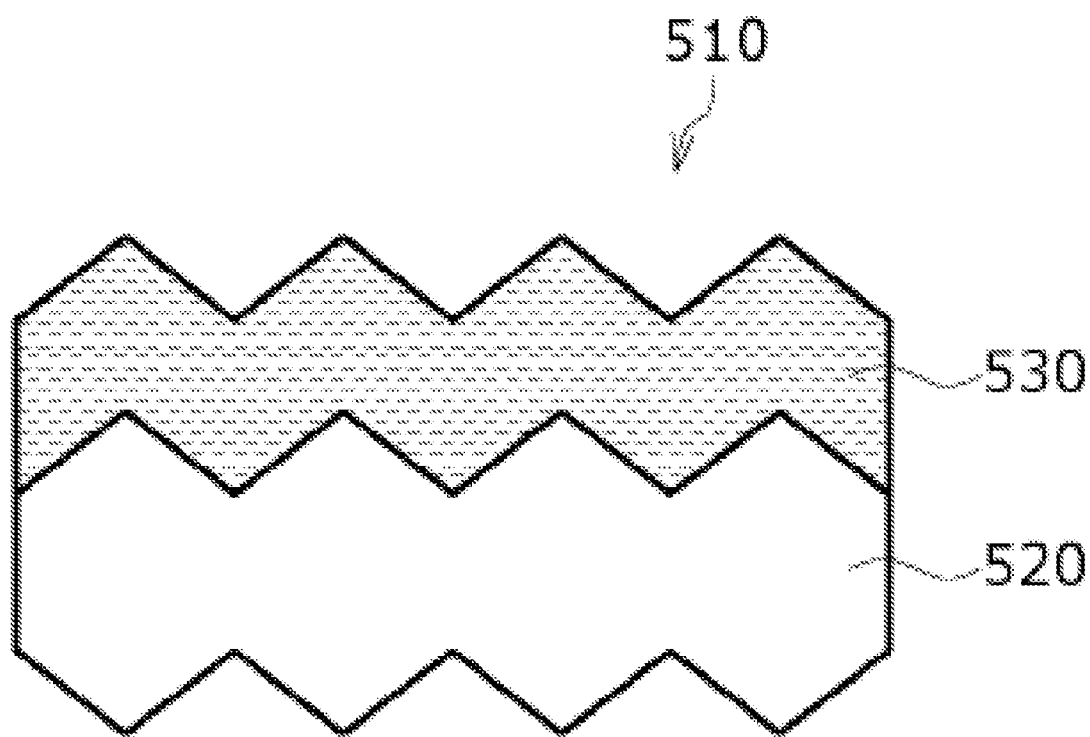
FIG. 11, corresponding to FIG. 8, is a schematic sectional view in a thickness direction of a multi-junction solar cell of further modified example of the second embodiment.
Figure 12:
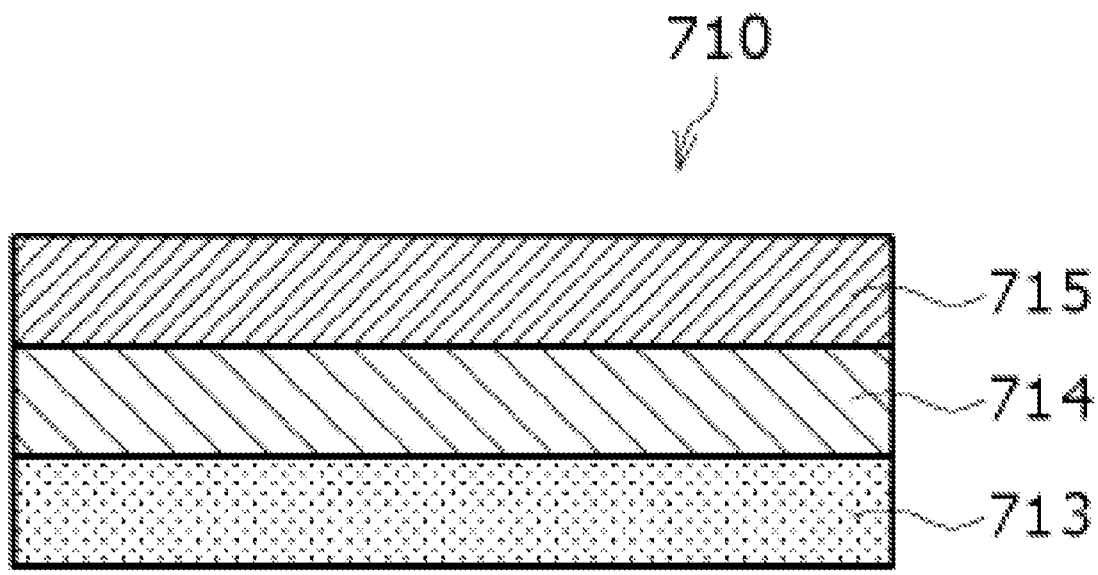
FIG. 12 is schematic sectional view of a main stacked part of a solar cell of a conventional example.

Alternatively, the texture structure may be formed on the second main surface, which is the light-receiving surface side, in addition to the second main surface, which is the rear surface side, of the crystalline silicon substrate, constituted of a silicon material, in a bottom cell 520. Such a configuration is illustrated in FIG. 11, which is a schematic sectional view in a thickness direction of a multi-junction solar cell 510 of a further modified example, and which corresponds to FIG. 8. Also, in this case, in the multi-junction solar cell 510, a top cell 530, which is constituted on the light-receiving surface side of the bottom cell 520, is of any type so long as it has the photoelectric conversion layer having a larger band gap than silicon. It is to be noted that the crystalline silicon substrate of the bottom cell does not necessarily have the texture structure on both of the first main surface and the second main surface in the multi-junction solar cell.

[Main Constitution of Solar Cell of the Present Disclosure and Effect Thereof]

The solar cell 10 comprises: an n-type (first conductivity type) first amorphous silicon layer 13 provided on a first main surface of the crystalline silicon substrate 11; an n-type amorphous silicon oxide layer 14 provided on a first main surface of the first amorphous silicon layer 13; and an n-type fine crystal silicon layer 15 provided on a first main surface of the amorphous silicon oxide layer 14. An oxygen atom concentration in the first amorphous silicon layer 13, the amorphous silicon oxide layer 14, and the fine crystal silicon layer 15 has a maximum value in the amorphous silicon oxide layer 14 with a thickness direction.

According to the present disclosure, the fine crystal silicon layer 15 may be easily and quickly crystallized because the n-type amorphous silicon is formed to be subjected to the oxidation treatment.

The solar cell 10 may comprise the substantially intrinsic first passivation layer 12 constituted with an amorphous silicon material between the first main surface of the crystalline silicon substrate 11 and a second main surface of the first amorphous silicon layer 13. In this case, the conductive first amorphous silicon layer 13 may be directly contacted with the substantially intrinsic first passivation layer 12 positioned under the first amorphous silicon layer 13 and on the rear surface side without an interposed oxide film. Thus, the dopant diffusion from the first amorphous silicon layer 13 to the first passivation layer 12 may be enhanced as compared to the above solar cells of Comparative Examples 1 and 2, and may increase conductivity of the first passivation layer 12. As a result, the fill factor and the conversion efficiency η may be increased.

In addition, a thickness of the low-conductive substantially intrinsic first passivation layer 12 may be set to have a thickness only required for passivating. Thus, the fill factor and the conversion efficiency q may be increased as compared with the solar cell described in Japanese Examined Patent Application Publication No. 5726377.

[Optional Constitution of Solar Cell and Effect Thereof]

The first passivation layer 12 and the first amorphous silicon layer 13 may be thinner than the fine crystal silicon layer 15.

This constitution may thin the solar cell 10 without deterioration of the output of the solar cell 10. Thus, the compact solar cell 10 may be easily produced without deterioration of the output of the solar cell 10, and the manufacturing cost of the solar cell 10 is easily reduced.

The solar cell 10 may comprise: the second passivation layer 22 constituted with an amorphous silicon material and provided on a second main surface of the crystalline silicon substrate 11; and a p-type (second conductivity type) second amorphous silicon layer 23 provided on a second main surface of the second passivation layer 22. A crystallization rate of the fine crystal silicon layer 15 may be higher than a crystallization rate of the second amorphous silicon layer 23. The crystallization rate is defined as a ratio (an intensity of light at 520 [$cm^{-1}$]/an intensity of light at 480 [$cm^{-1}$]) when a sample is measured by Raman spectroscopy.

Crystallizing a layer requires a long forming time, and desired crystallization requires skill. This constitution may shorten the manufacturing time of the solar cell 10 and may increase a degree of freedom of manufacturing conditions. Thus, mass productivity of the solar cell 10 may be improved, and the yield may be easily improved. In the solar cell of the present disclosure, an amorphous silicon oxide layer may be formed on the rear surface side, and a fine crystal silicon layer of a second conductivity type may be formed on a second main surface of the amorphous silicon oxide layer.

A concentration of the n-type atom in the first passivation layer 12 may be lower than $1 \times 10^{21}$ atoms/$cm^3$, and may be lower than a concentration of the n-type atom in the first amorphous silicon layer 13. A concentration of the p-type atom in the second passivation layer 22 may be lower than $1 \times 10^{21}$ atoms/$cm^3$, and may be lower than a concentration of the p-type atom in the second amorphous silicon layer 23.

This constitution may easily increase the output power of the solar cell 10.

A concentration of the n-type atom contained in the first amorphous silicon layer 13 may be lower than $1 \times 10^{22}$ atoms/$cm^3$. A concentration of the n-type atom contained in the fine crystal silicon layer 15 may be lower than $1 \times 10^{2}$ atoms/$cm^3$.

Since the concentration of the n-type atom contained in the fine crystal silicon layer 15 is lower than $1 \times 10^{2}$ atoms/$cm^3$, the fine crystal silicon layer 15 is easily and smoothly crystallized.

A transparent electrode (transparent conductive film layer) 10, 24 may be provided on at least one of a first main surface of the fine crystal silicon layer 15 and a second main surface of the second amorphous silicon layer 23.

This constitution may increase an intensity of light reaching the photoelectric conversion layer.

An arithmetic-average roughness of the fine crystal silicon layer 15 may be equal to or greater than an arithmetic-average roughness of the second amorphous silicon layer 23.

According to this constitution, the perovskite solar cell is easily produced on the light-receiving surface of the solar cell 10.

The solar cell (multi-junction solar cell) 210, 310, 410, 510 of the present disclosure comprises: a bottom cell 220, 320, 420, 520 constituted with a silicon material; and a top cell (second solar cell) 230, 330, 430, 530 having a photoelectric conversion layer 211, 311 having a larger band gap than silicon.

The present disclosure may allow the power generation performance of the solar cell 210, 310, 410, 510 to become excellent with light having a wide wavelength region and to improve the output.

The first amorphous silicon layer 13 and the fine crystal silicon layer 15 may be formed in the same chemical vapor deposition chamber without atmospheric exposure. The first passivation layer 12 and the first amorphous silicon layer 13 may be formed in the same chemical vapor deposition chamber without atmospheric exposure.

More specifically, in the production of the solar cell 10 described by using FIG. 1 and the like, all of the formation of the passivation layer on the first main surface of the crystalline silicon, formation of the n-type amorphous silicon layer, the oxidation treatment, and formation of the n-type fine crystal silicon may be performed in the same CVD chamber. During these sequential treatments, and transfer of the chamber and the tray and atmospheric exposure are not necessarily performed.

This constitution requires no additional apparatus, such as a chamber or a tray, for forming an intrinsic silicon layer including no conductive impurity. This constitution also requires no process time for completely evacuating an impurity in the atmosphere; thus, the time of manufacturing process may be remarkably shortened.

The present disclosure is not limited to the above embodiments and modified examples thereof. Various improvements and changes may be made within a range of a subject matter set forth in the claims and equivalents thereof.

For example, described above is forming the n-type silicon layer on the light-receiving surface side by setting the first conductivity type to n-type and setting the second conductivity type to p-type. In the solar cell of the present disclosure, however, a p-type silicon layer may be formed on the light-receiving surface side by setting the first conductivity type to p-type and setting the second conductivity type to n-type. Since simply reversing the conductivity, this case may also obtain the same effect as the case of setting the first conductivity type to n-type.

More specifically, when a solar cell is produced with simply reversed conductivity from the many solar cells described in the above sections, for example, [Main Constitution of Solar Cell of the Present Disclosure and Effect Thereof] and [Optional Constitution of Solar Cell and Effect Thereof], the same excellent effect as the above may be obtained. Needless to say, to reverse the conductivity, the atom having the n-type conductivity, such as P, is replaced with the atom having the p-type conductivity, such as B, and the atom having the p-type conductivity, such as B, is replaced with the atom having the n-type conductivity, such as P.

Described is a case where the amorphous silicon oxide layer is the first conductivity type. In the solar cell of the present disclosure, however, the amorphous silicon oxide layer is not necessarily the first conductivity type. In the solar cell of the present disclosure, the amorphous silicon oxide layer may be intentionally produced so as not to have the first conductivity. This is because such a configuration also may enhance the fine crystallization of the fine crystal silicon layer of the first conductivity type without change in the effect.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell, comprising:
a first amorphous silicon layer of a first conductivity type provided on a first main surface of a crystalline silicon substrate;
an amorphous silicon oxide layer provided on a first main surface of the first amorphous silicon layer; and
a microcrystalline silicon layer of the first conductivity type provided on a first main surface of the amorphous silicon oxide layer, wherein
a concentration of oxygen atoms in the first amorphous silicon layer, the amorphous silicon oxide layer, and the microcrystalline silicon layer has a maximum value in the amorphous silicon oxide layer with a thickness direction, and
the solar cell further comprises a first passivation layer constituted with an amorphous silicon material between the first main surface of the crystalline silicon substrate and a second main surface of the first amorphous silicon layer.

2. The solar cell according to claim 1, wherein a thickness of the microcrystalline silicon layer is larger than a thickness of the first passivation layer, and larger than a thickness of the first amorphous silicon layer.

3. The solar cell according to claim 1, further comprising:
a second passivation layer constituted with an amorphous silicon material and provided on a second main surface of the crystalline silicon substrate; and
a second amorphous silicon layer of a second conductivity type provided on a second main surface of the second passivation layer, wherein
a crystallization rate of the microcrystalline silicon layer is higher than a crystallization rate of the second amorphous silicon layer.

4. The solar cell according to claim 1, further comprising:
a second passivation layer constituted with an amorphous silicon material and provided on a second main surface of the crystalline silicon substrate; and
a second amorphous silicon layer of a second conductivity type provided on a second main surface of the second passivation layer, wherein
the first passivation layer includes atoms of the first conductivity type, and the second passivation layer includes atoms of the second conductivity type,
a concentration of atoms of the first conductivity type in the first passivation layer is lower than $1 \times 10^{21}$ atoms/cm$^3$ and lower than a concentration of atoms of the first conductivity type in the first amorphous silicon layer, and a concentration of atoms of the second conductivity type in the second passivation layer is lower than $1\times10^{21}$ atoms/cm$^3$ and lower than a concentration of atoms of the second conductivity type in the second amorphous silicon layer.

5. The solar cell according to claim 1, wherein a concentration of atoms of the first conductivity type contained in the first amorphous silicon layer is lower than $1\times10^{21}$ atoms/cm$^3$, and a concentration of atoms of the first conductivity type contained in the microcrystalline silicon layer is lower than $1\times10^{21}$ atoms/cm$^3$.

6. The solar cell according to claim 1, further comprising:

a second passivation layer constituted with an amorphous silicon material and provided on a second main surface of the crystalline silicon substrate;

a second amorphous silicon layer of a second conductivity type provided on a second main surface of the second passivation layer; and a transparent conductive layer provided on at least one of a first main surface of the microcrystalline silicon layer and a second main surface of the second amorphous silicon layer.

7. The solar cell according to claim 1, further comprising:

a second passivation layer constituted with an amorphous silicon material and provided on a second main surface of the crystalline silicon substrate; and a second amorphous silicon layer of a second conductivity type provided on a second main surface of the second passivation layer, wherein an arithmetic-average roughness on the microcrystalline silicon layer is equal to or more than an arithmetic-average roughness on the second amorphous silicon layer.

8. A multi junction solar cell, comprising:

the solar cell according to claim 1; and a second solar cell provided on the solar cell and including a photoelectric conversion layer having a larger band gap than silicon.

9. A method of manufacturing the solar cell according to claim 1, wherein the first amorphous silicon layer and the microcrystalline silicon layer are formed in the same chemical vapor deposition chamber without an atmospheric exposure.

10. A method of manufacturing the solar cell according to claim 1, wherein the first passivation layer and the first amorphous silicon layer are formed in the same chemical vapor deposition chamber without an atmospheric exposure.

* * * * *